United States Patent [19]
Kerber

[11] Patent Number: 5,847,433
[45] Date of Patent: Dec. 8, 1998

[54] INTEGRATED SWITCHING CIRCUIT WITH CMOS CIRCUIT AND METHOD FOR PRODUCING ISOLATED ACTIVE REGIONS OF A CMOS CIRCUIT

[75] Inventor: Martin Kerber, München, Germany

[73] Assignee: Siemens Aktiengesellschaft, Munich, Germany

[21] Appl. No.: 681,296

[22] Filed: Jul. 22, 1996

[30] Foreign Application Priority Data

Jul. 20, 1995 [DE] Germany ................. 195 26 568.8

[51] Int. Cl.$^6$ .................................................. H01L 29/76
[52] U.S. Cl. ................................. 257/369; 257/630
[58] Field of Search ................. 257/369, 630, 257/294, 368

[56] References Cited

U.S. PATENT DOCUMENTS

| | | | |
|---|---|---|---|
| 4,688,063 | 8/1987 | Lu et al. ............................... | 357/23.6 |
| 4,825,278 | 4/1989 | Hillenius et al. ..................... | 357/53 |
| 5,097,310 | 3/1992 | Eimori et al. ......................... | 257/371 |
| 5,164,803 | 11/1992 | Ozaki et al. .......................... | 257/372 |
| 5,181,094 | 1/1993 | Eimori et al. ......................... | 257/372 |
| 5,463,238 | 10/1995 | Takahashi et al. .................... | 257/351 |

OTHER PUBLICATIONS

IEDM 93, pp. 475–478, "CAD–Compatible High–Speed CMOS/SIMOX Technology Using Field–Shield Isolation for 1M Gate Array" (Jwamatsu et al).

IEEE Transactions on Electron Devices, vol. 36, No. 4, Apr. 1989, pp. 651–657; (Manchanda et al.) "A High–Performance Directory Insertable Self–. . . Gigaherttz Silicon NOMS/COMS VLSI".

*Primary Examiner*—Sara W. Crane
*Attorney, Agent, or Firm*—Herbert L. Lerner; Laurence A. Greenberg

[57] ABSTRACT

In an integrated switching circuit with a CMOS circuit and a method for producing isolated active regions of the CMOS circuit, a field plate is doped jointly with wells located beneath it, so that the field plate includes an n-doped region and a p-doped region, and a boundary layer forms in a transition region. Upon electrical connection of the field plate regions with the particular well located beneath them, a flat band condition prevails at a substrate surface.

6 Claims, 1 Drawing Sheet

INTEGRATED SWITCHING CIRCUIT WITH CMOS CIRCUIT AND METHOD FOR PRODUCING ISOLATED ACTIVE REGIONS OF A CMOS CIRCUIT

BACKGROUND OF THE INVENTION

FIELD OF THE INVENTION

The invention relates to an integrated switching circuit with a CMOS circuit, having field plate regions above at least one well that serve to electrically shield the well located beneath them. The invention also relates to a method for producing isolated active regions of a CMOS circuit.

When CMOS circuits are built up on a semiconductor surface, the active components, that is the two complementary transistors, must be isolated from one another.

Typically, the active regions of integrated CMOS circuits are isolated by local oxidation of silicon. This is also known as the LOCOS technique. A structured nitride layer is used as an oxidation barrier, and outside the covered regions on the silicon surface, a gate oxide that is approximately 600 to 1000 nm thick is created by moist oxidation. Another conventional method is to etch a shallow trench and then fill the trench with an oxide (known as shallow trench isolation or STI).

The use of field plates of doped polysilicon that is covered by an oxide layer is also known. The field plate serves to shield the active region and is therefore coupled to the corresponding potential of the well located beneath it. The field plate must therefore be interrupted at transition regions between complementary wells.

SUMMARY OF THE INVENTION

It is accordingly an object of the invention to provide an integrated switching circuit with a CMOS circuit and a method for producing isolated active regions of a CMOS circuit, which overcome the hereinafore-mentioned disadvantages of the heretofore-known devices and methods of this general type, in which a space requirement of the CMOS circuit and especially a spacing between adjacent active regions are as small as possible and in which the method for producing the isolated active regions of a CMOS circuit requires especially little space.

With the foregoing and other objects in view there is provided, in accordance with the invention, an integrated switching circuit with a CMOS circuit, comprising complementary wells having a boundary region; field plate regions of complementary MOS transistors, the field plate regions each being disposed above a respective one of the wells for electrically shielding the well located beneath it, each of the field plate regions being doped with the same conduction type as the well located beneath it, and the field plate regions being joined together in the boundary region of the wells; and a depletion layer disposed in the boundary region.

According to the basic concept of the invention, the field plate regions of the complementary MOS transistors are doped with the same conduction type and a not substantially greater dopant concentration as the well located beneath them, the field plate regions are joined together in the boundary region of complementary wells, and a depletion layer is present in this boundary region. The field plate is accordingly constructed to be continuous, and it overlaps the complementary wells.

As a result, the spacing of two active regions located in complementary wells can be minimized. At the same time, a low isolation pitch is obtained.

In accordance with another feature of the invention, the dopant concentration in the wells and the field plate region is approximately $10^{17}$ to $10^{18}$ cm$^{-3}$. Due to the low dopant concentration, a depletion layer with adequate electric strength forms at the well edges at operating voltage. The same is true for the continuous field plate, having various regions which are doped in accordance with the well located beneath them, so that they need not be galvanically separated. A charge-carrier-free depletion layer forms between these regions as well.

In accordance with a further feature of the invention, the field plate region is electrically connected to the well located beneath it. Since moreover the charge carrier type of the field plate polysilicon matches that of the well located beneath it, virtual flat band conditions always prevail at the semiconductor surface, which guarantees reliable isolation between adjacent active regions, at least whenever the isolation length is no shorter than the minimum allowed gate length of the complementary MOSFETs. Due to the simultaneous implantation into the well and into the corresponding field plate, this is equally true for both types of transistor.

In accordance with an added feature of the invention, the contacting of the field plates is done through the use of overlapping or staggered well contacts. Since the field plates are only slightly doped, the result is Schottky contacts that are only polarized in the flow direction. Since only small blocking-state currents occur at the pn junctions of the field plate regions at the edges of the wells, only insignificant voltage drops result at the Schottky contacts.

In accordance with an additional feature of the invention, the field plates are joined together only in a partial region. This is typically a region in which additionally the gate polysilicon strip extends and in which it would otherwise have an influence on the well located beneath. As a result of this provision, the leakage current between complementary field plates can be reduced further.

In accordance with yet another feature of the invention, the wells are retrograde-doped.

With the objects of the invention in view there is also provided a method for producing isolated active regions of a CMOS circuit, especially to produce an integrated circuit, which comprises producing an oxide layer on a semiconductor substrate; applying a continuous field plate layer to the oxide layer while overlapping active regions; simultaneously doping a well and one field plate region of the field plate layer located above it with one mask technique by implantation; simultaneously doping a complementary well and another field plate region of the field plate layer located above it with a second mask technique; and providing the continuous field plate layer with two electrical contacts, connecting one electrical contact in the vicinity of the one field plate region (or one doped well), and connecting another electrical contact in the vicinity of the other field plate region (or other doped well).

In accordance with another mode of the invention, there is provided a method which comprises connecting each of the electrical contacts to the well located beneath it.

Through the use of this method, isolated field plates are obtained that have the same doping as the well located beneath them and that are preferably brought to the same potential as the well located beneath by an electrical connection. In that case, flat band conditions prevail at the semiconductor surface.

The structuring of the field plate layer to create the gate terminals is preferably done before the doping of the field plate regions and the particular wells located beneath them.

However, it is also alternatively possible to perform the doping of the field plate regions first, and only then to perform the structuring of the active regions.

Other advantages of this method are that the field plates being formed of polysilicon and a field oxide layer located above them can be produced at little effort or expense, that the entire production process can be carried out without CVD nitride deposition and ensuing moist oxidation, that the edge of the active regions is not mechanically strained in the production, and as a result only a minimal diode leakage current arises.

In accordance with a further mode of the invention, the method can also be used unmodified to produce a CMOS circuit on SOI (silicon-on-insulator) foundation material.

In accordance with a concomitant mode of the invention, there is provided a method which comprises structuring the field plate layer to produce recesses between the step of applying the continuous field plate layer to the oxide layer and the step of simultaneously doping the well and the one field plate region located above it.

Other features which are considered as characteristic for the invention are set forth in the appended claims.

Although the invention is illustrated and described herein as embodied in an integrated switching circuit with a CMOS circuit and a method for producing isolated active regions of a CMOS circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
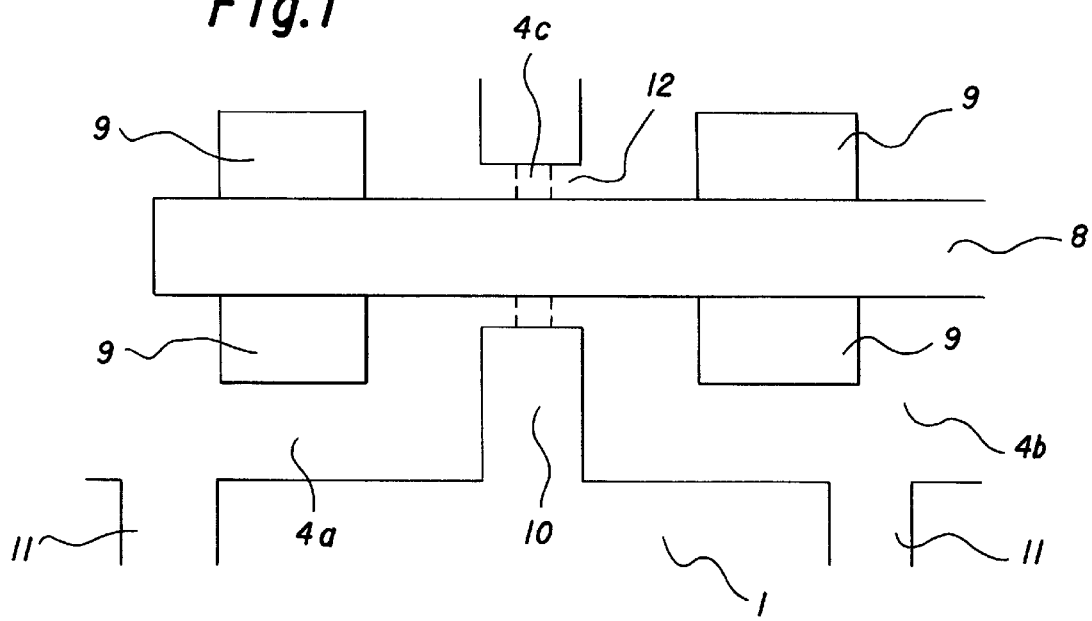
FIG. 1 is a fragmentary, diagrammatic, plan view of a CMOS circuit of the invention.
Figure 2:
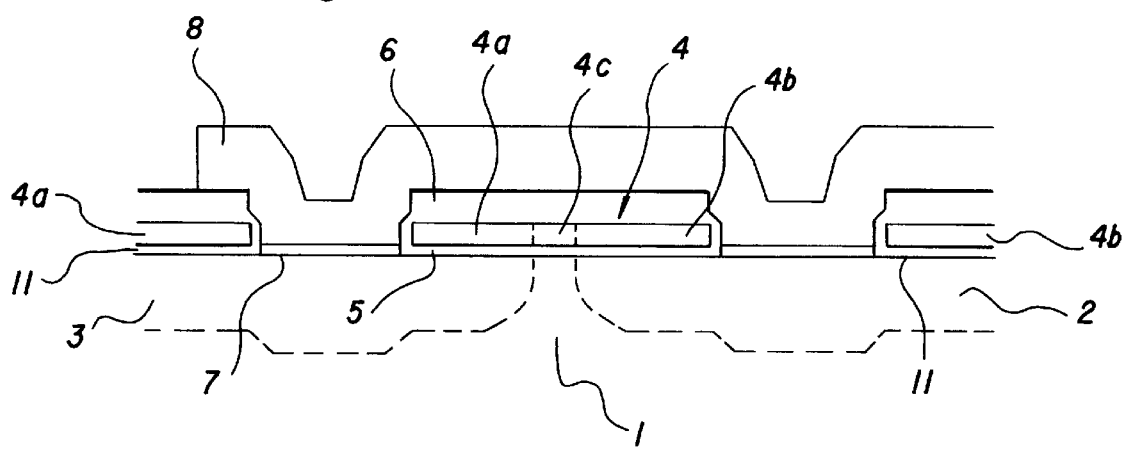
FIG. 2 is a cross-sectional view of the CMOS circuit of FIG. 1, which is taken along a gate structure.
Figure 3:
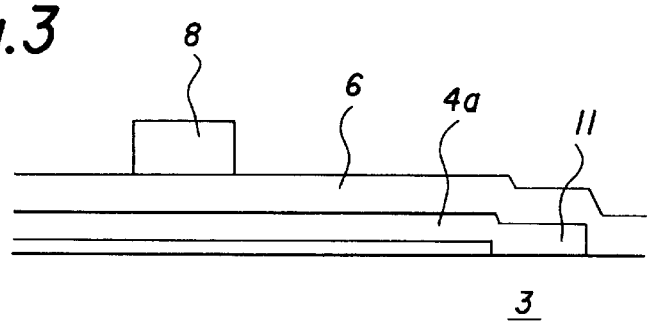
FIG. 3 is a cross-sectional view of the CMOS circuit along the line D–D'.

Referring now to the figures of the drawings in detail and first, particularly, to FIG. 1 thereof, there is seen a CMOS circuit in a plan view. Field plate regions 4a and 4b of a field plate which are located above a semiconductor substrate 1 surround active regions (typically including a source region, a channel region, and a drain region). Lateral dimensions of the field regions do not fall below a minimum amount. A charge-carrier-free depletion layer 4c is created in a transition region between the two field plate regions 4a and 4b. In the charge-carrier-free depletion layer 4c, an applied voltage plus a built-in diode voltage drops in the transition or boundary region between the field plate regions of complementary doping. The field plate regions 4a and 4b have recesses 9 in their interior, in which a gate electrode 8 is extended downward to a gate oxide 7 and a respective well located beneath it, as is seen in FIG. 2. A contact length of the field plate regions 4a and 4b is limited to a partial region below the gate polysilicon strip, so that a notch 10 is created between the field plate regions 4a and 4b. The field plate regions 4a and 4b have electrical contacts 11 for connecting the field plate regions 4a and 4b to the n-doped well 2 and the p-doped well 3 shown in FIG. 2.

FIG. 2 shows a cross section through FIG. 1, along the gate electrode 8. An n-doped well 2 and a p-doped well 3 have been produced in the semiconductor substrate 1 by implantation, and an oxide layer 5 is deposited over them. A field plate 4 extends over the entire CMOS circuit. The field plate includes the field plate region 4a, which is p-doped like the well 3 located beneath it, and the field plate region 4b, which is n-doped like the well 2 located beneath it. The field plate 4 is formed of a polysilicon layer that is approximately 70 nm in thickness, and it is separated from the substrate 1 and the respective wells 2 and 3 by the oxide layer 5 which is approximately 10 nn thick. The thickness of this oxide layer 5 is not critical, since with field plate regions connected to the wells, no voltage drops in this layer. The hole density and electric strength of this oxide are not critical, either. The field plate should be sufficiently thick to ensure that complete depletion cannot occur. This can be assured with a thickness of about 70 nm. The field plate is surrounded on the top by a field oxide 6 having a thickness of about 100 nm, which is thus thick enough to prevent the occurrence of a pronounced inversion in the polysilicon of the field plate. In general, however, one strives to keep the thickness of the field plate 4 and the field oxide layer 6 as slight as possible, in order to minimize the height of steps between the active transistor regions and the isolation region. The gate 8 is formed of a polysilicon layer with a thickness of about 250 nm.

In order to produce such a structure, the thin oxide layer 5 is generated by heat on a monocrystalline silicon wafer, which is shown in the drawings in the form of the semiconductor substrate 1. A nondoped silicon layer (which later becomes the field plate layer 4) having a slight thickness and being formed of polysilicon or amorphous silicon, which recrystallizes in the next high-temperature step, and the oxide layer 6, are deposited over the oxide layer. The oxide layer 6 is preferably generated by deposition of TEOS. The silicon layer 4 and the oxide layer 6 are structured anisotropically by a first phototechnique. Then the implantation for one MOS transistor type is introduced with a second phototechnique. In other words, the n-doped well 2, for instance, and the n-doped field plate region 4b located above it, are created. Corresponding masks for the implantation of the complementary transistor type are then made through the use of a third phototechnique. Next, the pdoped well 3 and the p-doped field plate region 4a above it are created. In the regions 9 and 10 that are not covered by a field plate region, the thin first oxide 5 is then isotropically removed and the gate oxide 7 is created, and the gate electrode 8 is deposited and structured over that.

In a conventional LOCOS process, the semiconductor surface in the region of the gate terminal would have to be oxidized with a layer about 200 nm thick, instead of the oxide layer 5 about 10 nm thick that is used in this case. By comparison, in the method of the invention the result is reduced dopant segregation and closer inception voltage tolerances.

I claim:

1. An integrated switching circuit with a CMOS circuit, comprising:

complementary doped wells sharing a boundary region;

field plate regions each disposed above a respective one of said wells for electrically shielding said well located beneath it, each of said field plate regions doped with the same conduction type as a conduction type of said well located beneath it, and said field plate regions joined together in said boundary region of said wells; and a depletion layer disposed in said field plate region above said boundary region, formed by adjusting a dopant concentration in said field plate regions, separating adjacent field plate regions of different conduction type.

2. The integrated switching circuit according to claim 1, wherein said wells and said field plate regions have a dopant concentration of approximately $10^{17}$ to $10^{18}$ cm$^{-3}$.

3. The integrated switching circuit according to claim 1, wherein each of said field plate regions is electrically connected to said well located beneath it.

4. The integrated switching circuit according to claim 1, wherein the CMOS circuit has at least one gate and said field plate regions are contacted with said wells by overlapping or staggered well contacts which are formed between overlapping regions of said field plate and said well in a region where no gate is present.

5. The integrated switching circuit according to claim 1, wherein said field plate regions are joined together only in a partial region.

6. The integrated switching circuit according to claim 1, wherein said wells are retrograde-doped.

* * * * *